United States Patent [19]

Pascucci

[11] Patent Number: 5,657,276
[45] Date of Patent: Aug. 12, 1997

[54] OUTPUT STAGE FOR INTEGRATED CIRCUITS, PARTICULARLY FOR ELECTRONIC MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 649,468

[22] Filed: May 17, 1996

[30] Foreign Application Priority Data

May 19, 1995 [EP] European Pat. Off. ............ 95830211

[51] Int. Cl.$^6$ .................................................. G01R 19/00
[52] U.S. Cl. ............................. 365/189.05; 365/189.06; 327/52
[58] Field of Search .................. 365/189.05, 189.06, 365/230.08; 327/51, 52, 53, 54, 55, 56

[56] References Cited

U.S. PATENT DOCUMENTS

| | | | |
|---|---|---|---|
| 4,250,412 | 2/1981 | Kung et al. | 307/279 |
| 5,067,109 | 11/1991 | Kim et al. | 365/189.05 |
| 5,481,500 | 1/1996 | Reohr et al. | 365/189.05 |
| 5,508,644 | 4/1996 | Branson et al. | 365/189.05 |

FOREIGN PATENT DOCUMENTS

| | | | |
|---|---|---|---|
| 0 136 486 | 4/1985 | European Pat. Off. | G11C 7/00 |
| 0 259 861 | 3/1988 | European Pat. Off. | G11C 11/24 |

*Primary Examiner*—David C. Nelms
*Assistant Examiner*—Vu A. Le
*Attorney, Agent, or Firm*—Wolf, Greenfield & Sacks, P.C.; James H. Morris

[57] ABSTRACT

An output stage for integrated circuits, particularly for electronic memories, including: an input section that is adapted to acquire an input datum; a latch circuit having a first output and a second output and connected to the input section; a first inverter connected to the second output; a second inverter connected to the first output; a third inverter connected to the output of the second inverter; a grounding transistor driven by the second output of the latch circuit and adapted to connect the output of the third inverter to the ground; and a push-pull stage driven by the output of the first and third inverters. The output stage according to the present invention furthermore includes: a shorting transistor adapted to connect the output of the first inverter to the output of the second inverter; a first enabling transistor interposed between the first inverter and the first output of the latch circuit; a second enabling transistor interposed between the second inverter and the second output of the latch circuit; and a section for charging and discharging the push-pull stage, which is adapted to rapidly discharge the gate of the first transistor of the push-pull stage and to charge the gate of the second transistor of the push-pull stage during their operation.

21 Claims, 5 Drawing Sheets

OUTPUT STAGE FOR INTEGRATED CIRCUITS, PARTICULARLY FOR ELECTRONIC MEMORIES

BACKGROUND OF THE INVENTION

1. Field of the Invention

The present invention relates to an output stage for integrated circuits, particularly for electronic memories having a large number of outputs.

2. Discussion of the Related Art

Various stages for electronic memories are known. Unfortunately, these stages are often highly complex and occupy a wide area of silicon in the chip wherein they are integrated.

Furthermore, since known stages have the characteristic of containing inductive/capacitive phenomena (which cause noise), the need is felt to reduce the noise present at the outputs of memories and to improve the general robustness of the output stages.

Another drawback of known output stages is that there is often a crowbar current, that is to say, a current flowing through the output transistors, which are normally arranged in a push-pull configuration, during the switching on the output from logic value "1" to logic value "0".

The size of the output transistors of the push-pull stage cannot be reduced excessively in order to minimize noise, since it is necessary to meet specifications of output stage currents.

Therefore, one aim of the present invention is to provide an output stage for integrated circuits, particularly for electronic memories, which is structurally simpler than known output stages.

Within the scope of this aim, an object of the present invention is to provide an output stage for integrated circuits, particularly for electronic memories, that comprises a smaller number of transistors than known output stages.

Another object of the present invention is to provide an output stage for integrated circuits, particularly for electronic memories, that produces less noise.

Another object of the present invention is to provide an output stage for integrated circuits, particularly for electronic memories, that reduces the sum of the current pulses on the stage output.

Another object of the present invention is to provide an output stage for integrated circuits, particularly for electronic memories, that avoids the signals to the stage buffers to be modified and therefore avoids rebounds.

Another object of the present invention is to provide an output stage for integrated circuits, particularly for electronic memories, that reduces the variation in the charge and/or discharge currents on the stage output, consequently reducing inductive/capacitive phenomena on the stage output lines.

Another object of the present invention is to provide an output stage for integrated circuits, particularly for electronic memories, that reduces the noise produced by the switching of the push-pull output of the stage.

Another object is to provide an output stage that provides an uncoupling between the output stage and the internal circuits (interaction, noise propagation).

Another object of the present invention is to provide an output stage for integrated circuits, particularly for electronic memories, that is highly reliable, relatively easy to manufacture, and at competitive costs.

SUMMARY OF THE INVENTION

This aim, these objects and others which will become apparent hereinafter are achieved by an output stage, particularly for electronic memories, comprising an input section adapted to acquire an input datum; a latch circuit having a first output and a second output and connected to said input section; a first inverter connected to said second output; a second inverter connected to said first output; a third inverter connected to the output of said second inverter; a grounding transistor driven by said second output of said latch circuit and adapted to connect the output of said third inverter to the ground; and a push-pull stage driven by the output of said first and third inverters.

The stage according to the present invention also comprises: a shorting transistor for connecting the output of said first inverter to the output of said second inverter; a first enabling transistor interposed between said first inverter and said first output of said latch circuit; a second enabling transistor interposed between said second inverter and said second output of said latch circuit; and a section for charging and discharging said push-pull stage, which is adapted to rapidly discharge the gate of the first transistor of said push-pull stage and to charge the gate of the second transistor of said push-pull stage during their operation.

BRIEF DESCRIPTION OF THE DRAWINGS

The features and advantages of the present invention will become apparent from the description of a preferred but not exclusive embodiment thereof, illustrated only by way of non-limitative example in the accompanying drawings, wherein.

DETAILED DESCRIPTION

Figure 1:
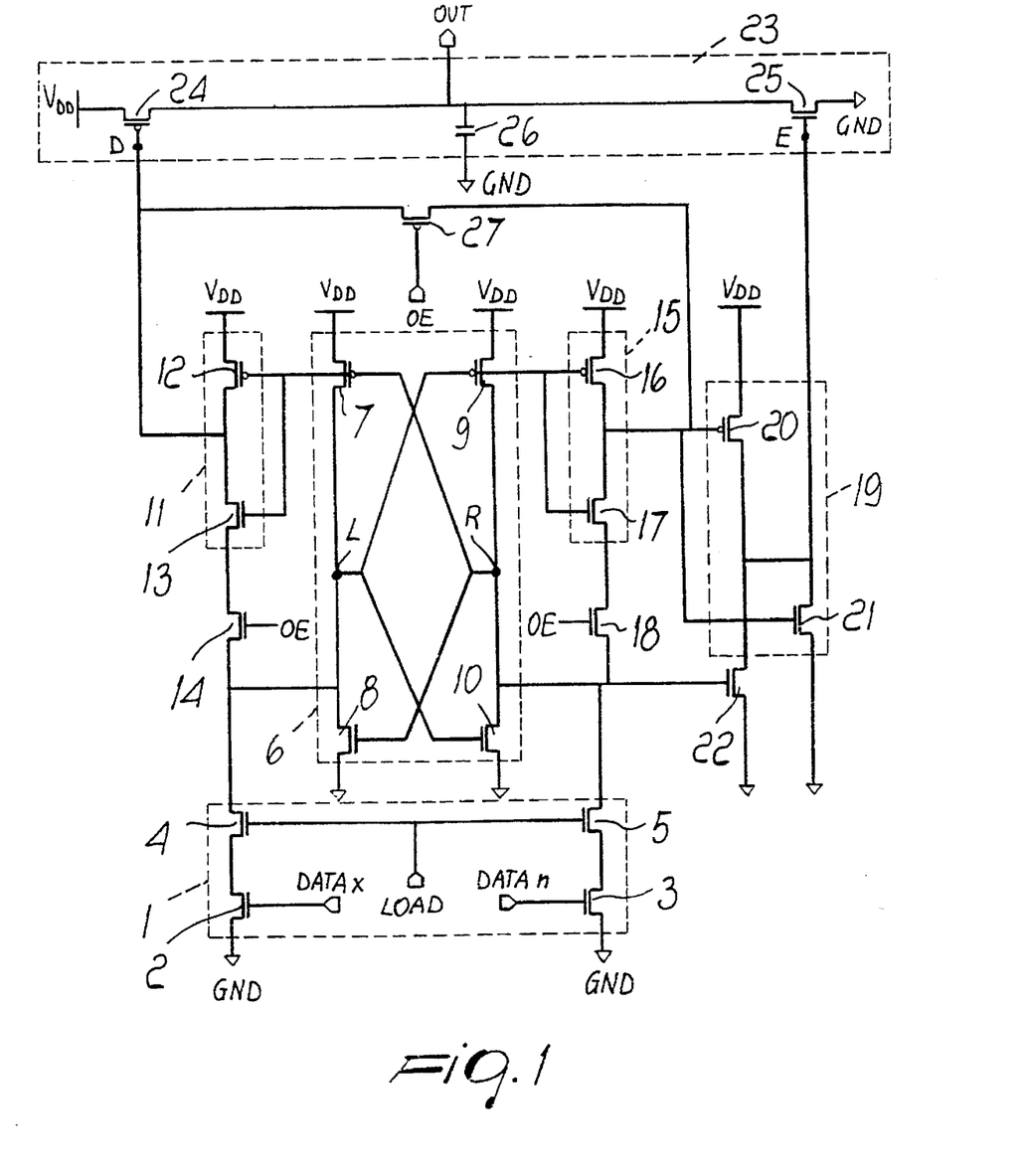
FIG. 1 is a circuit diagram of the stage according to the present invention.

With reference to FIG. 1, the reference numeral 1 designates the input section of the stage according to the present invention. Said section 1 has two inputs for the input datum: a first input DATAx, which receives the non-inverted input datum, and a second input DATAn, which receives the inverted input datum.

Each one of the two inputs DATAx and DATAn is respectively connected to the gates of a first input transistor 2 and of a second input transistor 3, both of the N-channel type. The sources of the transistors 2 and 3 are connected to the ground GND.

The input transistors 2 and 3 are furthermore series-connected to respective sampling transistors 4 and 5, also of the N-channel type. The gates of the sampling transistors 4 and 5 are driven by a sampling signal LOAD. The sampling signal LOAD can preferably be of the pulse type in order to provide better uncoupling of the output stage from the internal circuits. The drains of the transistors 4 and 5 constitute the outputs of the input section 1.

The outputs of the input section 1 are connected respectively to a first node L and to a second node R of a latch circuit 6. The latch circuit comprises a first narrow (in practice, slow) P-channel transistor 7, the drain terminal whereof is connected to the supply voltage $V_{DD}$. The source of the transistor 7 is connected to the drain of a first wide (fast) N-channel transistor 8, the source terminal whereof is connected to the ground GND. The latch circuit 6 also comprises a second narrow P-channel transistor 9, the drain terminal whereof is connected to the supply voltage $V_{DD}$ and the source terminal whereof is connected to the drain of a second wide N-channel transistor 10. The source of the transistor 10 is connected to the ground GND. The relative speeds of the transistors of the latch circuit make it relatively slow in the transition of the node that reaches the logic level "1".

The first node L of the latch circuit 6 is interposed between the first transistors 7 and 8 and is connected to the gates of the second transistors 9 and 10, whereas the second node L is interposed between the second transistors 9 and 10 and is connected to the gates of the first transistors 7 and 8.

The second node R of the latch circuit 6 is connected to the input of a first inverter circuit with virtual ground 11. The inverter 11 comprises a wide P-channel transistor 12 (in order to cause the transition of the inverter to "1" to be fast) that is connected to the supply voltage and a narrow N-channel transistor 13 (in order to cause the transition of the inverter to "0" to be slow) that is series-connected to said P-channel transistor 12. The input of the inverter circuit 11 is connected to the gates of the transistors 12 and 13, whereas the output of the inverter 11 is constituted by a node interposed between the transistors 12 and 13.

The inverter 11 is series-connected to the drain of a first enabling N-channel transistor 14, to the gate whereof an enabling signal OE (Output Enable) is applied. The source of the transistor 14 is connected to the first node L of the latch circuit 6 and to the first output of the input section 1.

The first node L of the latch circuit 6 is instead connected to a second inverter circuit with virtual ground 15, which comprises a wide P-channel transistor 16 (in order to cause the transition of the inverter to "1" to be fast) that is connected to the supply voltage and a narrow N-channel transistor 17 (in order to cause the transition of the inverter to "0" to be slow) that is series-connected to said P-channel transistor 16. The input of the inverter circuit 15 is connected to the gates of the transistors 16 and 17, whereas the output of the inverter 15 is constituted by a node interposed between the transistors 16 and 17.

The inverter 15 is series-connected to the drain of a second enabling N-channel transistor 18, to the gate whereof the enabling signal OE (Output Enable) is applied. The source of the transistor 18 is connected to the second node R of the latch circuit 6 and to the second output of the input section 1.

The output of the second inverter 15 is connected to a third inverter circuit 19 that comprises a narrow P-channel transistor 20 (in order to cause the transition of the inverter to "1" to be slow) that is connected to the supply voltage and a wide N-channel transistor 21 (in order to cause the transition of said inverter to "0" to be fast) that is series-connected to said P-channel transistor 20. The input of the inverter circuit 19 is connected to the gates of the transistors 20 and 21, whereas the output of the inverter 19 is constituted by a node interposed between the transistors 20 and 21.

The second node R of the latch circuit 6 is also connected to the gate of an N-channel grounding transistor 22 that connects the output of the inverter 19 to the ground voltage GND.

The output of the first inverter 11 is connected to a first input of a push-pull stage 23, which is constituted by the gate of a P-channel transistor 24 connected to the supply voltage $V_{DD}$. The output of the third inverter 19 is connected to a second input of the push-pull circuit 23, which is constituted by an N-channel transistor 25 connected to the ground. The transistor 24 and the transistor 25 are series-connected and an output terminal OUT is interposed therebetween. The terminal OUT is also connected to the ground voltage by means of a capacitor 26. Finally, the outputs of the first inverter 11 and of the second inverter 15 are connected to a P-channel shorting transistor 27, to the gate whereof the enabling signal OE is applied.

The operation of the output stage according to the present invention is as follows.

Assume that the enabling signal OE is equal to the logic value "1", that is to say, that the output stage is enabled. If a "1" is present on the non-inverting input DATAx of the input section 1 and a "0" is present on the inverting input DATAn, the input transistor 2 is switched on. The sampling signal LOAD, which is a periodic or occasional pulse signal, also switches on the first sampling transistor 4. In this manner, the first node L of the latch circuit 6 is connected to the ground, that is to say, it is set to the logic value "0". Accordingly, the second node R of the latch circuit 6 and the input of the first inverter 11 reach the logic level "1". Therefore, the output of the first inverter 11 is a "0", which is applied to the gate of the P-channel transistor 24 of the push-pull stage 23.

On the other side, since the first node L of the latch circuit 6 is set to "0", the output of the second inverter 15 is a "1" and the output of the third inverter 19 is a "0". The output of the third inverter 19 sets the gate of the N-channel transistor 25 of the push-pull stage 23 to "0". The grounding transistor 22 also sets the same line to the "0" level.

In this manner, there is a logic level "0" on both transistors 24 and 25 of the push-pull stage 23 and the output OUT is set to the supply voltage $V_{DD}$ by the transistor 24, that is to say, it is set to the logic level "1".

It is to be noted that the N-channel transistor 25 is set to "0" more quickly than the P-channel transistor 24, because the transistor 25 is set to "0" by means of the transistors 16 and 21, which have a relatively great width (speed), and by means of the transistor 22, which is connected directly to the latch and has a relatively great width, whereas the transistor 24 is set to "0" by means of the transistor 13, which is relatively narrow (slow).

Likewise, when a "0" is present at the non-inverting input DATAx and a "1" is present at the inverting input DATAn, the P-channel transistor 24 is faster in reaching level "1" than the N-channel transistor 25. This is due to the fact that the transistor 24 is set to "1" by means of the transistor 12, which is relatively wide, whereas the transistors 17 and 20 that set the transistor 25 to "1" are relatively narrow (slow).

In this manner, the crowbar current is avoided, since the two transistors 24 and 25 of the push-pull stage 23 can never be switched on simultaneously.

The operation of the circuit in the condition OE=1, DATAx=0, DATAn=1 is not explained, since it is evident from the aforegoing description.

Assume now that the enable signal is deactivated, that is to say, OE=0. With a non-inverting input DATAx=1 and an input DATAn=0, the first node L of the latch circuit 6 is set to "0", whereas the second node R is set to "1".

The first node L sets the output of the second inverter 15 to "1" and the output of the third inverter to "0". This logic level is applied to the gate of the N-channel transistor 25, which obviously is not switched on.

On the other side, the second node R of the latch circuit 6 switches on the transistor 13 of the first inverter 11 but does not set the output of the inverter 11 to the logic value "0", since the enabling transistor 14 is off. Therefore, the output of the inverter 11 is of the floating type. However, since the shorting transistor 27 is on, it sets the output of the first inverter 11 to the logic value of the output of the second inverter 15, that is to say, to the logic level "1". In this manner, a "1" is applied to the gate of the P-channel transistor 24 and said transistor is not switched on. Since both transistors 24 and 25 of the push-pull stage 23 are not switched on, the output terminal OUT has a floating logic level.

In this manner, the output of the stage at three levels, known as "tri-state", is obtained.

The operation of the device with OE=0, DATAx=0, and DATAn=1 can be easily deduced from the aforegoing description.

Figure 2:
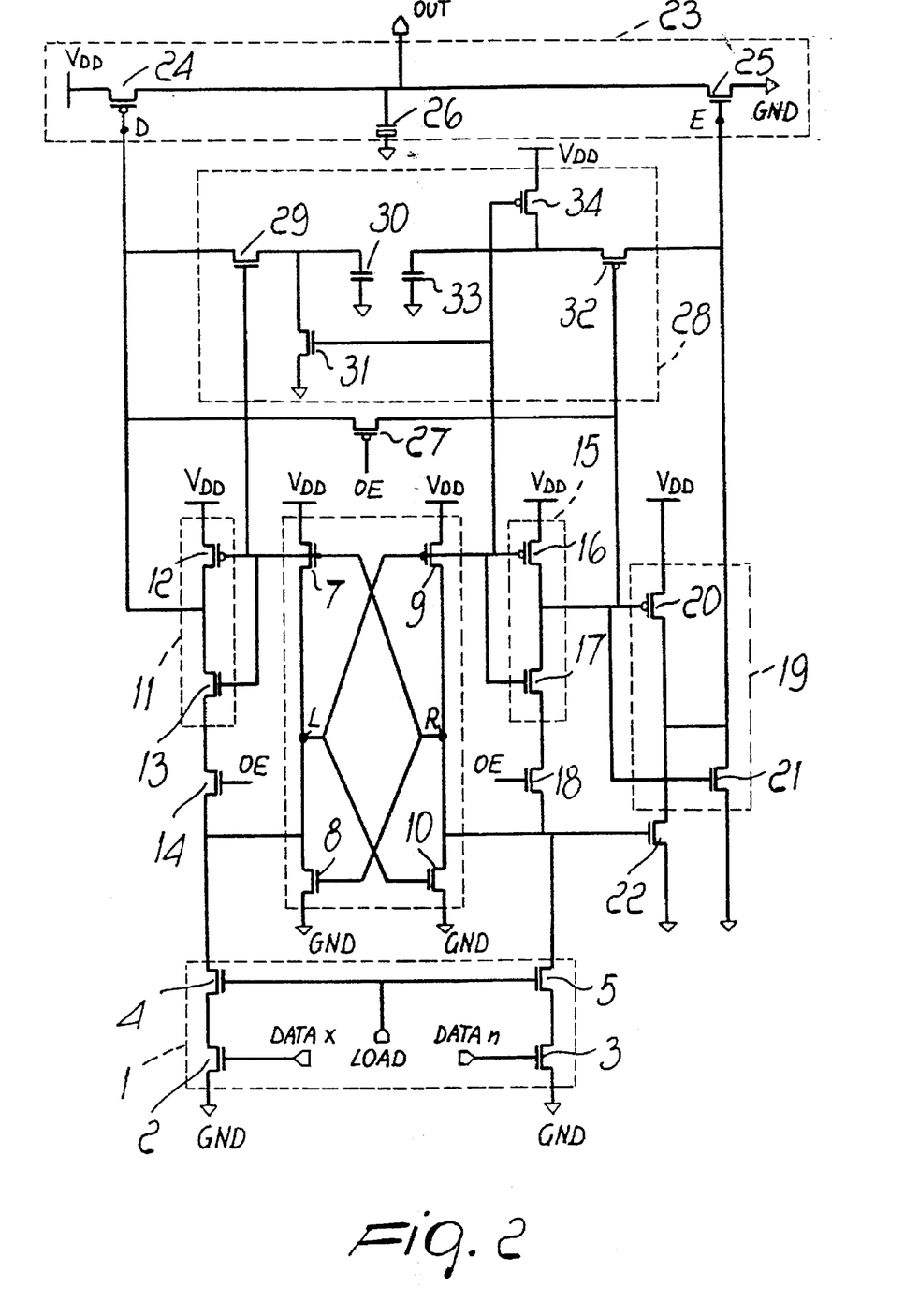
FIG. 2 is an improved circuit diagram of the output stage according to the present invention.

FIG. 2 illustrates an improved embodiment of the output stage according to the present invention with particular reference to the charge and/or discharge speed of the transistors of the push-pull stage 23.

The circuit of FIG. 2 is substantially identical to the circuit of FIG. 1, except that it comprises a charge and/or discharge section for the push-pull stage 23. Said charge and discharge section is designated by the reference numeral 28. Said section 28 comprises a first discharge N-channel transistor 29 adapted to discharge the transistor 24 of the push-pull stage 23. The transistor 29 is series-connected to a discharge capacitor 30 which is in turn connected to the ground GND. The gate of the transistor 29 is connected to the second node R of the latch circuit 6. Furthermore, a second discharge N-channel transistor 31 is series-connected to the capacitor 30, is parallel-connected to the transistor 29, and is adapted to discharge the capacitor 30 towards the ground, whereto it is connected. The gate of the transistor 31 is connected to the first node L of the latch circuit 6.

The charge and discharge section 28 also comprises a first charge P-channel transistor 32 adapted charge the P-channel transistor 25 of the push-pull stage 23, whereto it is series-connected. The gate of the transistor 32 is connected to the output of the second inverter 15. The transistor 32 is series-connected to a charge capacitor 33 adapted to charge the transistor 25 across said charge transistor 32. The capacitor 33 is connected to the ground with its other terminal. A second charge P-channel transistor 34, connected to the supply voltage $V_{DD}$, is series-connected to the charge capacitor 33 and parallel-connected to the first charge transistor 32. The gate of the second charge transistor 34 is connected to the first node L of the latch circuit 6.

The dimensions of the capacitors 30 and 33 are set so that the activation voltage at the gates of the transistors 24 and 25 of the push-pull stage 23 is such as to limit the maximum current pulse of the final push-pull stage and to lower the gradient dV/dt on the transistors 24 and 25, reducing the capacitive/inductive phenomena (oscillations) that cause noise.

The operation of the part of the output stage that does not include the charge and discharge section 28 is identical to the operation of the circuit of FIG. 1 and therefore only the operation of the charge and discharge section 28 is explained hereinafter.

Assume that the first node L of the latch circuit 6 is set to the logic level "1" and that the second node R is set to the logic level "0". The logic level present at the gates of the transistors of the push-pull stage 23 is a "1" and therefore the transistor 25 is switched on. However, a "1" is present at the output of the second inverter 15 and therefore the first charge transistor 32 is also switched on. Said transistor 32 charges the gate of the transistor 25 with the voltage $V_{DD}$ present across the charge capacitor 33, which has been charged beforehand, as explained hereinafter.

At the same time, the first discharge transistor 29 is switched off, whereas the second discharge transistor 31 is switched on and discharges the charge of the discharge capacitor 30, setting the voltage across said capacitor to the ground value.

When the latch circuit 6 changes its state, that is to say, when the first node L is set to "0" and the second node R is set to "1", there is a logic level "0" at the gates of the transistors of the push-pull stage 23. Therefore the P-channel transistor 24 is switched on. Furthermore, the first discharge transistor 29 is also switched on, discharging the charge present at the gate of the transistor 24 onto the discharge capacitor 30. At the same time, the first charge transistor is switched off, while the second charge transistor is switched on and charges the capacitor 33 with the supply voltage $V_{DD}$.

Figure 3:
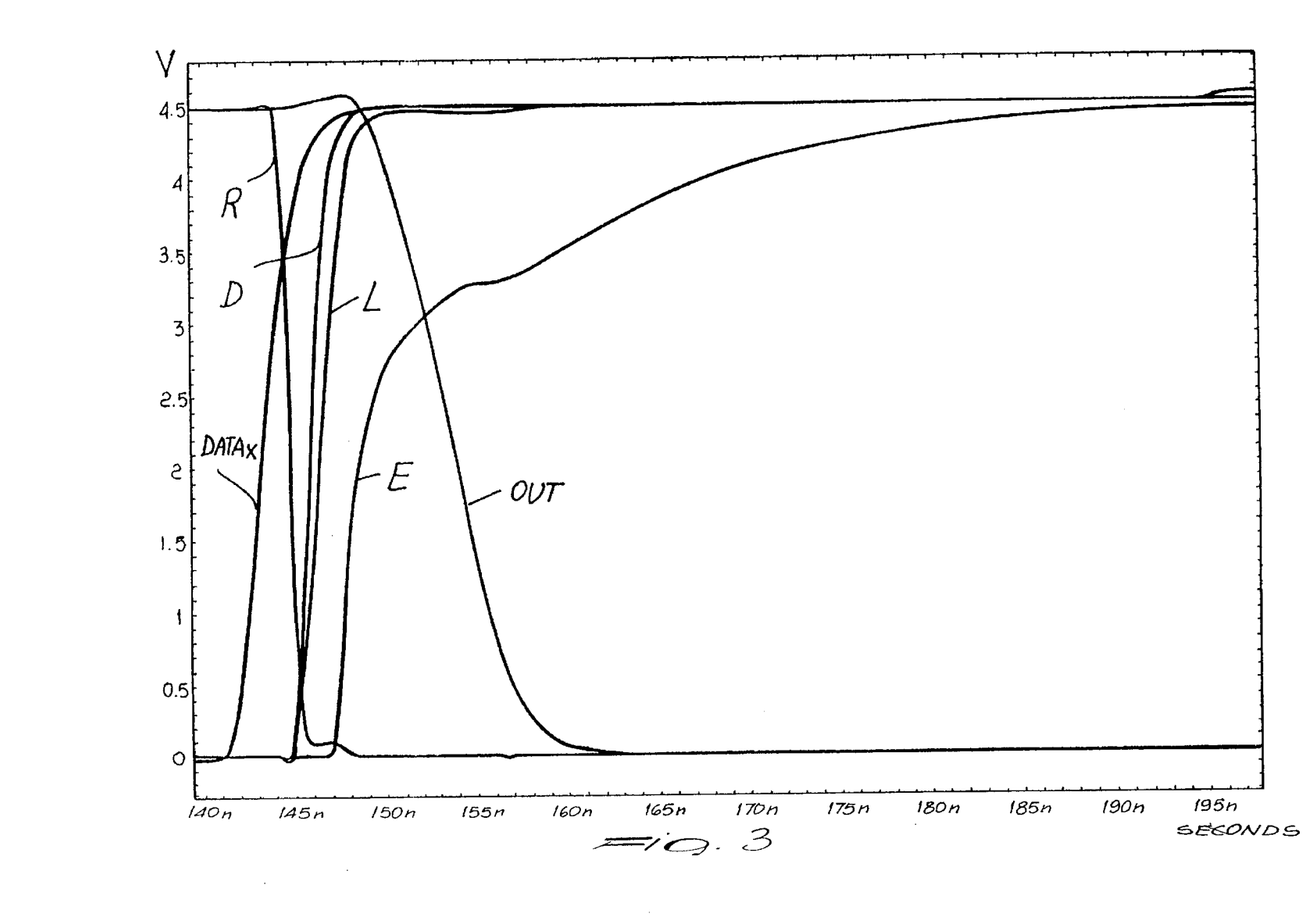
FIG. 3 is a plot of the waveforms of the voltages present on various nodes of the output stage according to the present invention for an input datum present at the stage input and having a first logic level.
Figure 4:
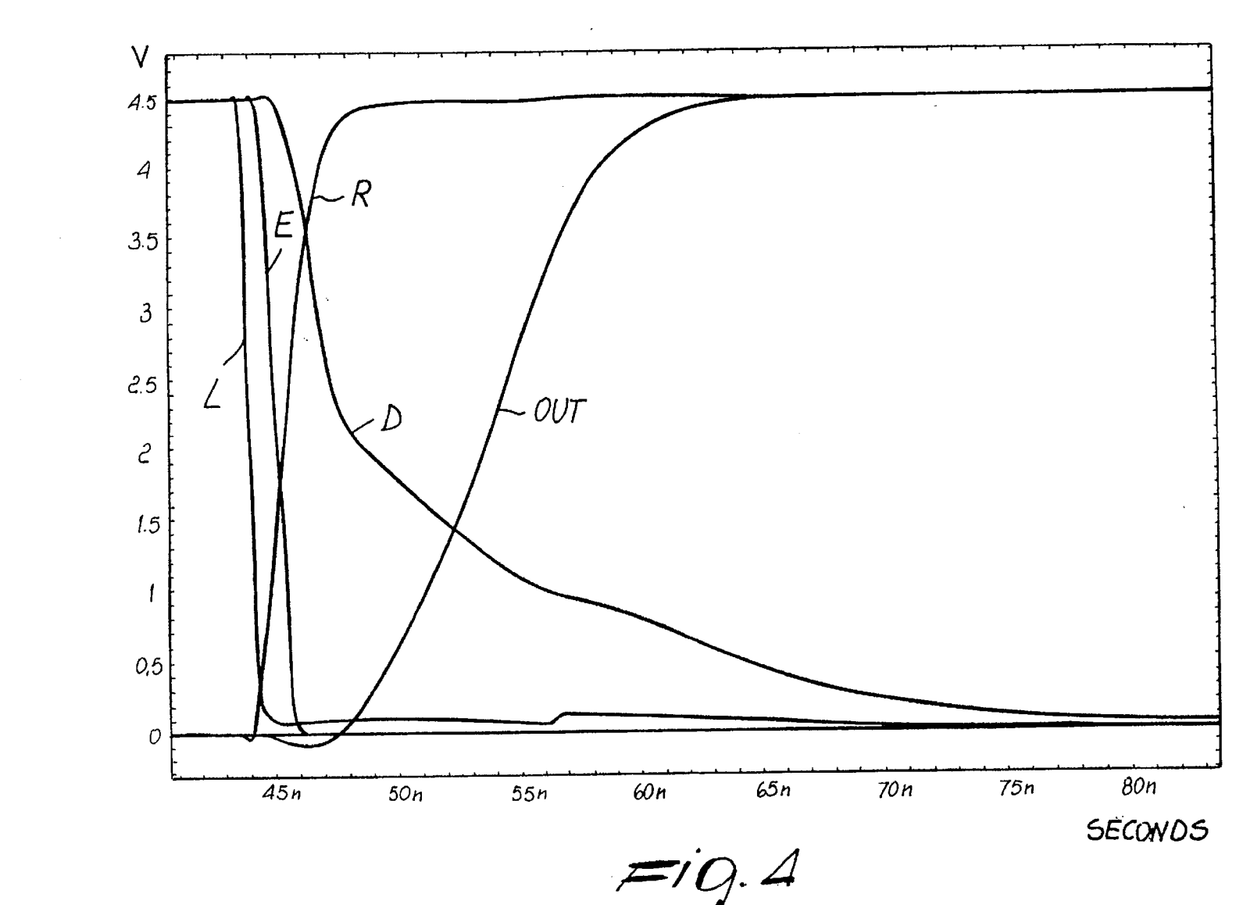
FIG. 4 is a plot of the waveforms of the voltages present on various nodes of the output stage according to the present invention for an input datum present at the stage input and having a second logic level.

FIGS. 3 and 4 illustrate various waveforms of the voltages present across some nodes of the stage according to the present invention. The nodes L and R are the first and second nodes of the latch circuit 6. The node DATAx is the node of the non-inverting input of the input section 1. The node D is the gate of the transistor 24 of the push-pull stage 23. The node E is the gate of the transistor 25 of the push-pull stage 23. The node OUT is the output of the stage according to the present invention.

With reference to FIG. 3, when the input datum DATAx rises to the level "1", the second node R, owing to the configuration of the latch 6 (the relative speeds of the transistors), drop to "0" at once. Immediately after, due to the speed of the transistors that drive it, the node D (the gate of the transistor 24 that is switched off) rises to the level "1". Only after this has occurred, the first node L of the latch 6 rises to the level "1". The voltage across the node E (the gate of the transistor 25 that is switched on) instead rises first with a very steep gradient due to the capacitive discharge of the capacitor 33 onto the gate of the transistor 25, which quickly sets an optimal level, and then continues to rise with a less steep gradient carried and completed to its asymptotic level $V_{DD}$ by the resistive transistor 20. The output OUT drops with a gradient that has a linear behavior (discharge of the capacitor 26 at constant current), as shown in FIG. 3.

With reference to FIG. 4, the opposite case is shown. When the input datum DATAx (not shown) drops to "0", the first node L drops immediately thereafter, due to the configuration of the latch 6. This node is followed immediately by the node E (the gate of the transistor 25 that is switched off) and only after, the node R rises to the value "1". The node D (the gate of the transistor 24 that is switched on) first drops with a very steep gradient due to the charge and discharge section 28 (which discharges the gate of the transistor 24 to an optimum value) and then continues its complete discharge to GND due to the resistive path of the transistors 13 and 14 with a less steep gradient.

The output OUT charges substantially at the constant current of the capacitor 26.

It can be noted that one transistor of the push-pull stage is always switched off before the other transistor is switched on, thus eliminating the crowbar current. Furthermore, due to the steep gradient of the quick charge/discharge of the output transistors, the noise present at the output of the stage is significantly reduced.

Figure 5:
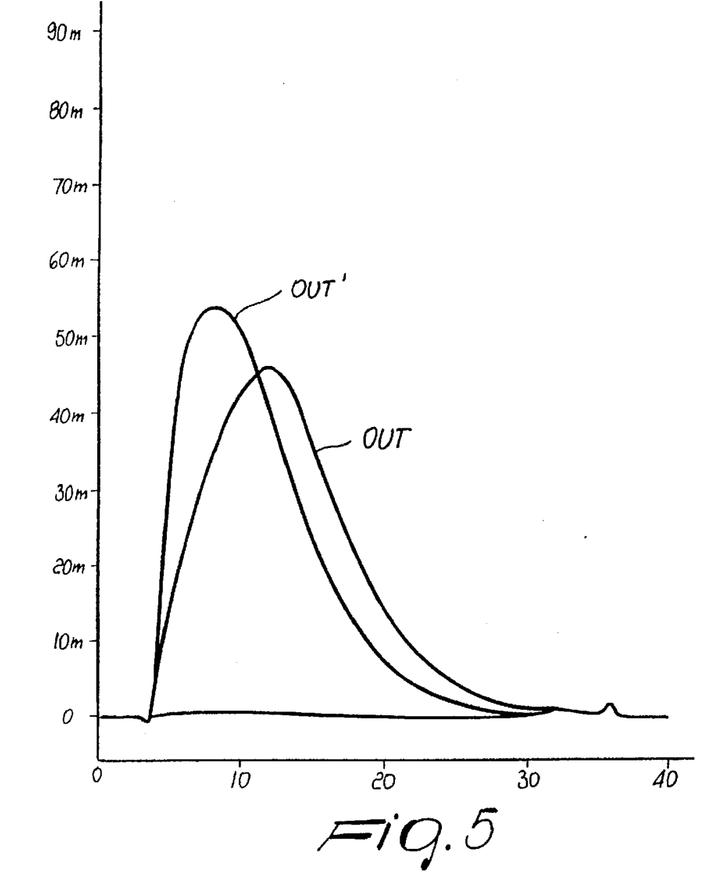
FIG. 5 is a plot of the current on the P-channel transistor of the push-pull stage.
Figure 6:
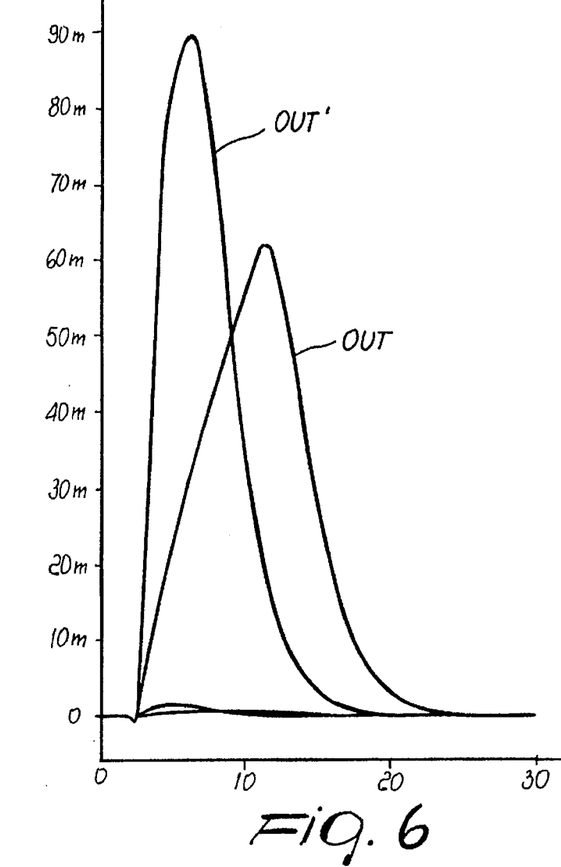
FIG. 6 is a plot of the current on the N-channel transistor of the push-pull stage.

FIGS. 5 and 6 respectively plot the behaviour of the currents of the transistors 24 and 25 of the push-pull stage 23 with and without the charge and discharge section 28. The signal OUT plots the current with the section 28 and the signal OUT' plots the current without the section 28. As clearly shown, the amplitude of the current peaks is significantly reduced, providing a first improvement as regards the noise produced by the push-pull stage 23. Furthermore, the pulse gradient is considerably reduced, and this also significantly reduces the inductive effects, always linked to the bondings of said outputs of the integrated circuit.

From the aforesaid it is evident that the present invention fully achieves at least the intended aim and objects.

The invention thus conceived is susceptible of numerous modifications and variations, all of which are within the scope of the inventive concept.

Thus, for example, the polarities of the transistors may be inverted.

Furthermore, although the illustrated transistors are of the MOSFET type, they can also be of other kinds.

Finally, all the details may be replaced with other technically equivalent ones.

In practice, the materials employed, as well as the shapes and the dimensions, may be any according to the requirements without thereby abandoning the protective scope of the claims that follow.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Output stage for integrated circuits, particularly for electronic memories, comprising:
    an input section adapted to acquire an input datum;
    a latch circuit having a first output and a second output and connected to said input section;
    a first inverter connected to said second output;
    a second inverter connected to said first output;
    a third inverter connected to the output of said second inverter;
    a grounding transistor driven by said second output of said latch circuit and adapted to connect the output of said third inverter to the ground; and
    a push-pull stage driven by the output of said first and third inverters.

2. Output stage according to claim 1, wherein said first and second inverters are of a virtual ground type.

3. Output stage according claim 1, further comprising: a shorting transistor for connecting the output of said first inverter to the output of said second inverter; a first enabling transistor interposed between said first inverter and said first output of said latch circuit; and a second enabling transistor interposed between said second inverter and said second output of said latch circuit.

4. Output stage according to claim 1, wherein said input section comprises an inverting input and a non-inverting input.

5. Output stage according to claim 1, wherein said input section comprises means for sampling said inputs.

6. Output stage according to claim 4, wherein said non-inverting input drives a first transistor connected to the ground and in that said inverting input drives a second transistor connected to the ground.

7. Output stage according to claim 5, wherein said sampling means comprise a third transistor that is series-connected to said first transistor and a fourth transistor that is series-connected to said second transistor, said third and fourth transistors being driven by a sampling signal.

8. Output stage according to claim 1, wherein said latch circuit comprises: a first transistor of a first polarity, which is series-connected to a second transistor of a second polarity; a third transistor of said first polarity, which is series-connected to a fourth transistor of said second polarity; said first output being interposed between said first and second transistors, said second output being interposed between said third and fourth transistors, said first output being connected to the gates of said third and fourth transistors, and said second output being connected to the gates of said first and second transistors.

9. Output stage according to claim 8, wherein said first and third transistors are slower than said second and fourth transistors.

10. Output stage according to claim 1, wherein said first inverted comprises a first transistor of said first polarity that is series-connected to a second transistor of said second polarity, the input of said inverter being constituted by the gates of said transistors and the output being interposed between said first and second transistors.

11. Output stage according to claim 10, wherein said first transistor is faster than said second transistor.

12. Output stage according to claim 1, wherein said second inverter comprises a first transistor of said first polarity that is series-connected to a second transistor of said second polarity, the input of said inverter being constituted by the gates of said transistors and the output being interposed between said first and second transistors.

13. Output stage according to claim 12, wherein said first transistor is faster than said second transistor.

14. Output stage according to claim 1, wherein said third inverter comprises a first transistor of said second polarity that is series-connected to a second transistor of said first polarity, the input of said inverter being constituted by the gates of said transistors and the output being interposed between said first and second transistors.

15. Output stage according to claim 14, wherein said second transistor is faster than said first transistor.

16. Output stage according to claim 14, wherein said grounding transistor is faster than said first transistor.

17. Output stage according to claim 1, wherein said push-pull stage comprises a first transistor of said first polarity that is connected to a second transistor of said second polarity.

18. Output stage according to claim 17, further comprising a section for charging and discharging said push-pull stage that is adapted to rapidly discharge the gate of said first transistor and to rapidly charge the gate of said second transistor during their operation.

19. Output stage according to claim 18, wherein said charge and discharge section comprises a first quick discharge capacitor and a second quick charge capacitor.

20. Output stage according to claim 19, wherein said charge and discharge section comprises a first transistor of said second polarity, which connects said discharge capacitor to the gate of said first transistor of said push-pull stage, and a second transistor, which connects said discharge capacitor to the gate of said second transistor of said push-pull stage, said first transistor being driven by said second output of said latch circuit and said second transistor being driven by the output of said second inverter.

21. Output stage according to claim 20, wherein said charge and discharge section comprises a third transistor of said second polarity, which connects said discharge capacitor to the ground, and a fourth transistor of said first polarity, which connects said charge capacitor to a supply voltage, said third and fourth transistors being driven by said first output of said latch circuit.

* * * * *